United States Patent [19]
Hayes

[11] Patent Number: 6,107,608
[45] Date of Patent: Aug. 22, 2000

[54] TEMPERATURE CONTROLLED SPIN CHUCK

[75] Inventor: Bruce L. Hayes, Boise, Id.

[73] Assignee: Micron Technology, Inc., Boise, Id.

[21] Appl. No.: 08/823,799

[22] Filed: Mar. 24, 1997

[51] Int. Cl.$^7$ .............................. H05B 3/68; C23C 16/00
[52] U.S. Cl. ...................................... 219/444.1; 118/724
[58] Field of Search ............................. 219/444.1, 446.1, 219/448.11; 118/724, 725, 728, 730, 666, 667; 427/8, 10; 165/80.2, 80.5

[56] References Cited

U.S. PATENT DOCUMENTS

| | | | |
|---|---|---|---|
| 5,001,423 | 3/1991 | Arabmi et al. | 219/444.1 |
| 5,343,938 | 9/1994 | Schmidt . | |
| 5,580,607 | 12/1996 | Takekuma et al. | 427/240 |
| 5,881,208 | 3/1999 | Geyling et al. | 392/418 |
| 5,908,657 | 6/1999 | Kimura et al. | 427/240 |

*Primary Examiner*—Sam Paik
*Attorney, Agent, or Firm*—Kirkpatrick & Lockhart LLP

[57] ABSTRACT

An apparatus and a method of actively controlling the temperature of a surface of a workpiece is disclosed. The apparatus includes a heat exchanger and a temperature controller thermally coupled to a chuck having a support surface to provide for active controlling of the temperature of the support and a surface of a workpiece, such as a semiconductor wafer, placed thereon. In a preferred embodiment, the chuck includes an interior region that forms a portion of the heat exchanger and is connected by an inlet and an outlet to a heat exchange medium source that provides for the recirculation of heat transfer medium through the interior region. In a preferred method of operation, a heat exchanger is provided relative to the wafer support surface to allow heat to be transferred between the heat exchanger and the support surface so as to achieve a predetermined temperature for the support surface and the wafer. After the predetermined temperature of the support surface has been achieved, the wafer is brought into contact with the support surface and the spin dispensing of the process liquid onto the surface of the wafer is performed. The transfer of heat between the heat exchanger and the support surface can be continued or discontinued during the time when the wafer is contacting the support surface.

20 Claims, 14 Drawing Sheets

TEMPERATURE CONTROLLED SPIN CHUCK

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention generally relates to controlling the temperature of a workpiece. More particularly, the present invention relates to a thermally controlled rotatable wafer chuck to directly control the temperature of a semiconductor wafer during spin dispensing of a process liquid onto the wafer.

Integrated circuits are typically constructed by depositing a series of individual layers of predetermined materials on a wafer shaped semiconductor substrate, or "wafer". The individual layers of the integrated circuit are in turn produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist.

Photoresist materials are generally composed of a mixture of organic resins, sensitizers and solvents. Sensitizers are compounds, such as diazonaphthaquinones, that undergo a chemical change upon exposure to radiant energy, such as visible and ultraviolet light. The irradiated sensitizer material has different salvation characteristics with respect to various solvents than the nonirradiated material allowing for selective removal of the photoresist. Resins are used to provide mechanical strength to the photoresist and the solvents serve to lower the viscosity of the photoresist so that it can be uniformly applied to the surface of the wafers.

After a photoresist layer is applied to the wafer surface, the solvents are evaporated and the photoresist layer is hardened, usually by heat treating the wafer. The photoresist layer is then selectively irradiated through the use of a radiation opaque mask. The mask contains transparent portions that define the pattern for the next circuit layer. The mask is placed over the photoresist layer and the photoresist covered by the transparent portion is irradiated. The mask is removed and the photoresist layer is exposed to a process liquid, known as developer. The developer selectively solubilizes and removes either the irradiated or the nonirradiated photoresist exposing portions of the underlying insulating layer.

The exposed portions of the insulating layer can be selectively removed using an etchant to expose corresponding sections of the underlying circuit layer. In this process, the photoresist should be more resistant to the etchant than the insulating layer to limit the attack of the etchant to only the exposed portions of the insulating layer. Alternatively, the exposed underlying layer(s) can be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

Process liquids, such as photoresist, developer, etchants and solvents, are typically applied to the wafer using a spin dispensing technique in which the liquid is dispensed on the surface of the wafer as the wafer is spun on a rotating chuck. The spinning of the wafer distributes the liquid over the surface of the material and exerts a shearing force that separates some of the liquid from the wafer leaving a thin liquid layer on the surface of the wafer. A thin uniform layer of process liquid is important to provide for uniform action of the process liquid on the wafer surface, such as with developer, or to provide a suitable layer for the formation of subsequent circuit layer, as with photoresist.

The uniformity of the process liquid on the wafer depends on a number of factors, one of which is the temperature of the process liquid on the wafer. Generally, as the temperature of the wafer is increased, the process liquid dispensed onto the wafer will be more easily distributed over the surface due to decreasing viscosities of most process liquids with increasing temperature. However, for process liquids, such as photoresist, that have both volatile and nonvolatile components the increased temperature will cause accelerated evaporation of the volatile components from the process liquid. The loss of the volatile components increases the viscosity of the remaining process liquid, thereby making it more difficult to distribute the process liquid over the surface of the wafer. Whereas, lowering the temperature of the wafers will generally lower the viscosity of the process liquid making it more difficult to distribute the process liquid over the wafer surface. Although, in the case of photoresist, the lower temperature will reduce the amount of volatile component evaporation and resulting viscosity increases during the process. The nonuniform distribution of the process liquid resulting from temperature variations across the wafer contributes to defects in the coating layers which reduce the overall yield of properly performing chips from the wafer.

One attempt made in the prior art to provide for a more uniform distribution focused on minimizing the heat transferred to the wafer through the chuck from the spin motor, as disclosed in U.S. Pat. No. 5,343,938 issued to Schmidt. The Schmidt patent discloses an insulated wafer chuck for use in spin dispensing. The chuck contains an interior chamber that is either evacuated or filled with gas having a low thermal conductivity. The chamber serves to thermally isolate the wafer chuck from the spindle and spin motor so that the temperature of the chuck and the wafer are controlled by the surrounding environment. A problem with the prior art, including the Schmidt patent, is that the temperature of the wafer and the chuck are passively controlled by the surrounding environment in the spin dispensing apparatus. As a result, the wafer is subject to the temperature variations that occur in the surrounding environment, which generally must be controlled very precisely to ensure that the wafer is at the correct temperature for optimal uniformity of the dispense liquid. In the prior art, the environmental temperature in the processing chamber is oftentimes different than the temperature at which the wafer is stored. Therefore, an extra step of preconditioning the wafer in a special module is required prior to loading the wafer in the processing chamber. These problems all serve to increase the variability and complexity of the liquid spin dispensing process.

Thus, it is apparent that a need exists for an improved apparatus and method for controlling the temperature of a wafer during spin dispensing, which overcomes, among others, the above-discussed problems to produce a more uniform layer of process liquid over the surface of the wafer.

BRIEF SUMMARY OF THE INVENTION

The above objects and others are accomplished by an apparatus and a method of actively controlling the temperature of a surface of a workpiece, such as semiconductor wafer, in accordance with the present invention. The apparatus includes a heat exchanger and a temperature controller positioned relative to and thermally coupled with a chuck having a wafer support surface to provide for active controlling of the temperature of the support surface and a semiconductor wafer placed thereon.

In a preferred embodiment, the chuck includes an interior region that forms a portion of the heat exchanger. The chuck is connected by an inlet and an outlet to a heat exchange medium source that provides for the recirculation of the heat transfer medium through the interior region.

In a preferred method of operation, a heat exchanger is thermally coupled to the wafer support surface to allow heat to be transferred between the heat exchanger and the support surface so as to achieve a predetermined temperature for the support surface and the wafer placed thereon. After the predetermined temperature of the support surface has been achieved, the wafer is brought into contact with the support surface and the spin dispensing of the process liquid onto the surface of the wafer is performed. The transfer of heat between the heat exchanger and the support surface is preferably continued, but may be discontinued, during the time when the wafer is in contact with the support surface.

Accordingly, the present invention provides an improved chuck that allows for precise control over the temperature of the wafer, which overcomes the problems associated with the prior art, thereby eliminating the need for a separate preconditioning step and the need to attempt to control the wafer temperature via the environmental temperature of the chamber. These and other details, objects, and advantages of the invention will become apparent as the following detailed description of the present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF THE INVENTION

Figure 1:
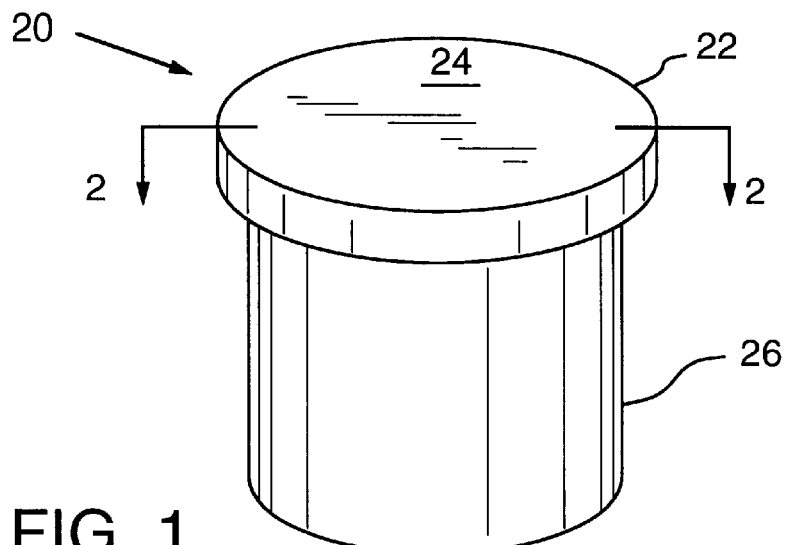
FIG. 1 is a perspective view of the chuck according to the present invention.

The operation of the apparatus 10 will be described generally with reference to the drawings for the purpose of illustrating present preferred embodiments of the invention only and not for purposes of limiting the same. The apparatus 10 of the present invention includes a chuck 20 that is thermally coupled to a heat exchanger 40 to allow heat transfer between the chuck 20 and the heat exchanger 40. The spin dispensing apparatus 10 further includes a bowl 14 disposed around the chuck 20, a spin motor 16 for spinning the chuck 20 supporting a semiconductor wafer 17 and a dispense assembly 18 that is connected to a process liquid source (not shown) and positionable to dispense process liquid onto the chuck 20.

As shown in FIG. 1, the chuck 20 preferably includes a disc shaped wafer support portion 22 having a wafer support surface 24 and a shaft 26 attached to the support portion 22 opposite and perpendicular to the support surface 24. The support portion 22 and the shaft 26 preferably have aligned central longitudinal axes around which the chuck 20 is rotated by the spin motor 16. The chuck 20 is preferably constructed of aluminum, but other materials having similar thermal and structural properties can also be used for the chuck 20.

Figure 2:
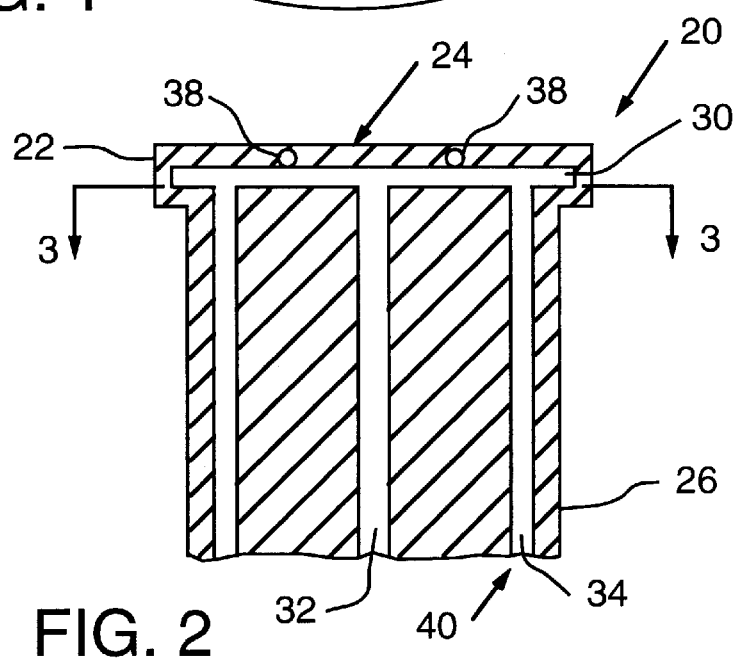
FIG. 2 is a side cross sectional view of along the line 2—2 of FIG. 1 of a preferred embodiment of the chuck of the present invention.
Figure 3:
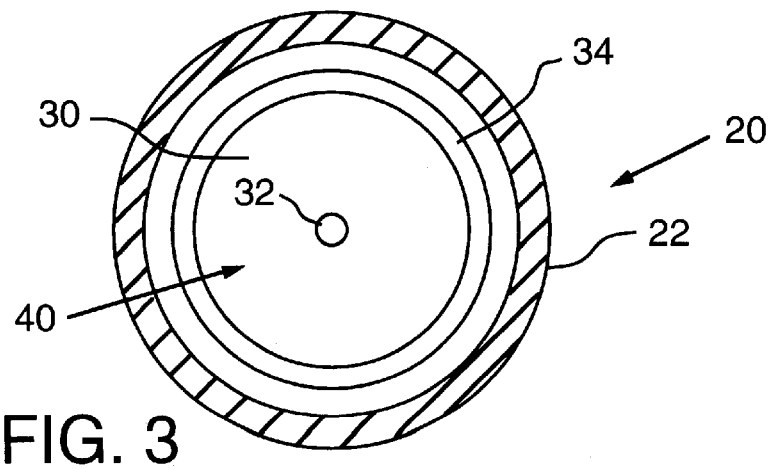
FIG. 3 is a top cross sectional view of along the line 3—3 of FIG. 2 of a preferred embodiment.

In a preferred embodiment, as shown in FIGS. 2 and 3, the chuck 20 has an interior region 30 proximate to the support surface 24, which is defined by a series of passageways connected to an inlet 32 and an outlet 34. The interior region 30 and the inlet and outlet, 32 and 34, respectively, define the portion of the heat exchanger 40, the remainder of which is not shown and can be remotely located, if desired. The inlet 32 and outlet 34 are annularly provided in the chuck 20 for attachment to a union joint to the remainder of the heat exchanger 40 and to allow for the flow of heat exchange media through the chuck 20 during spin dispensing operations. In this embodiment, it will be appreciated that the flow of the heat transfer media can be reversed so that the inlet 32 will serve as an outlet and vice versa. A temperature controller 38 is provided to control the amount of heat transferred between the heat exchanger 40 and the chuck 20. Preferably, the temperature controller 38 includes at least one temperature detector, such as a thermocouple, disposed within the chuck 20. The temperature controller 38 is connected to the heat exchanger 40 to preferably provide feedback control over the transfer of heat based on the detected temperature, as is known in the art. It will be appreciated that any number of thermocouples or other types of remote temperature detectors can be used to provide control data on the temperature of the chuck 20.

Figure 4:
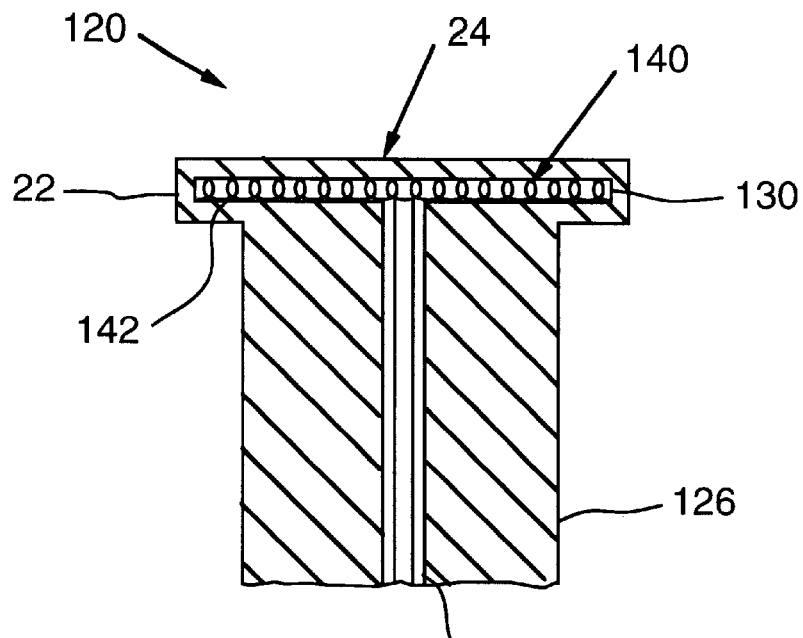
FIG. 4 is a side cross sectional view of a second embodiment of the present invention.
Figure 5:
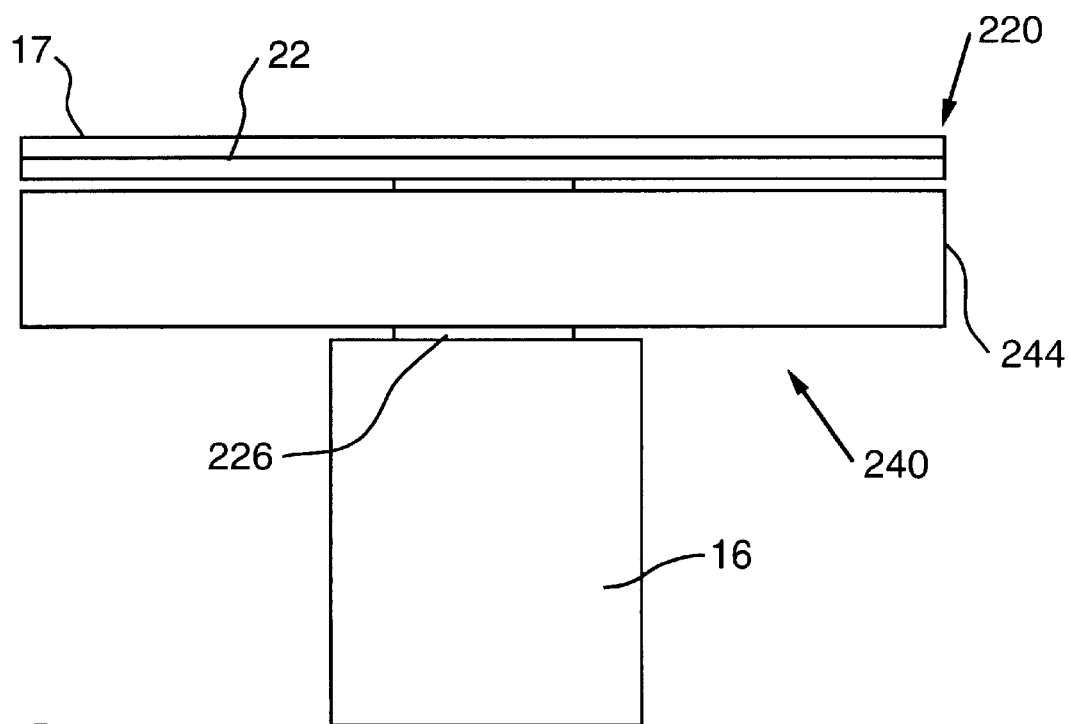
FIG. 5 is a side view of a third embodiment of the chuck.
Figure 6:
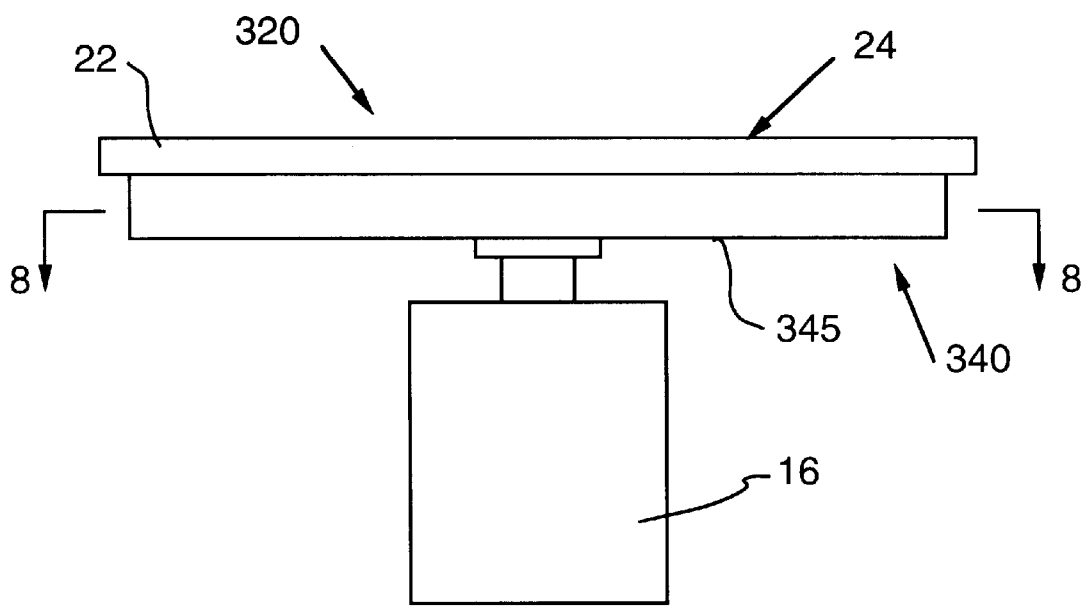
FIG. 6 is a side view of a fourth embodiment of the chuck.

In a second embodiment, as shown in FIG. 4, a heat exchanger 140 is provided in an interior region 130 of a chuck 120 and necessary wiring is provided through an inlet 132. The transferring of heat can be accommodated by resistance heaters 142 or thermoelectric cooling devices as necessary for a specific process. A benefit provided from both the first and second embodiments is that no additional hardware has to be added to the system.

Figure 7:
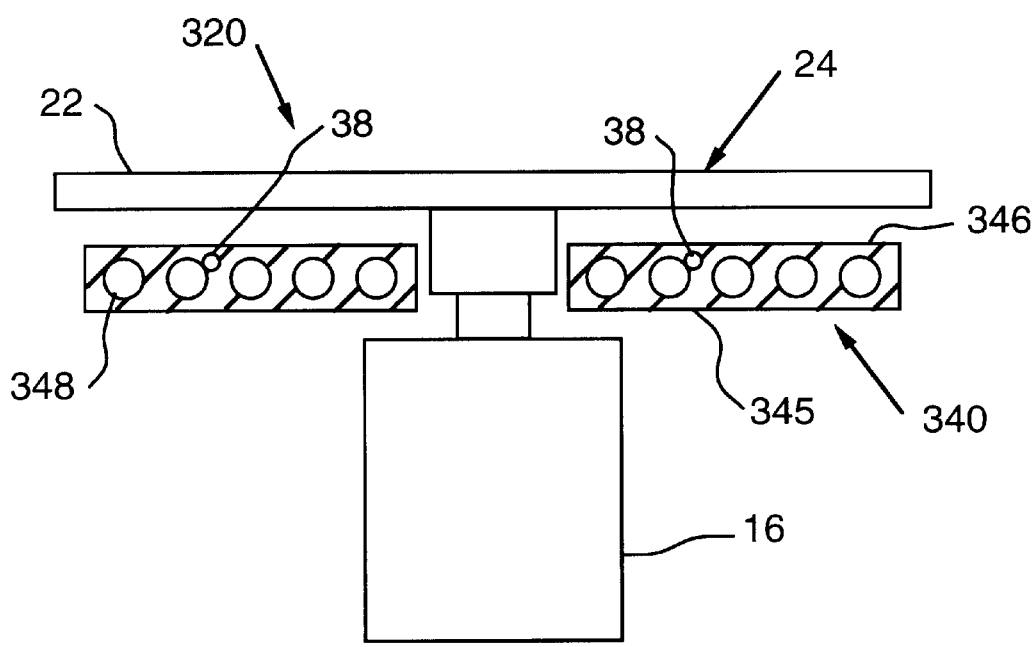
FIG. 7 is a side view of the fourth embodiment of the chuck providing a cross sectional view of the heat exchanger.
Figure 8:
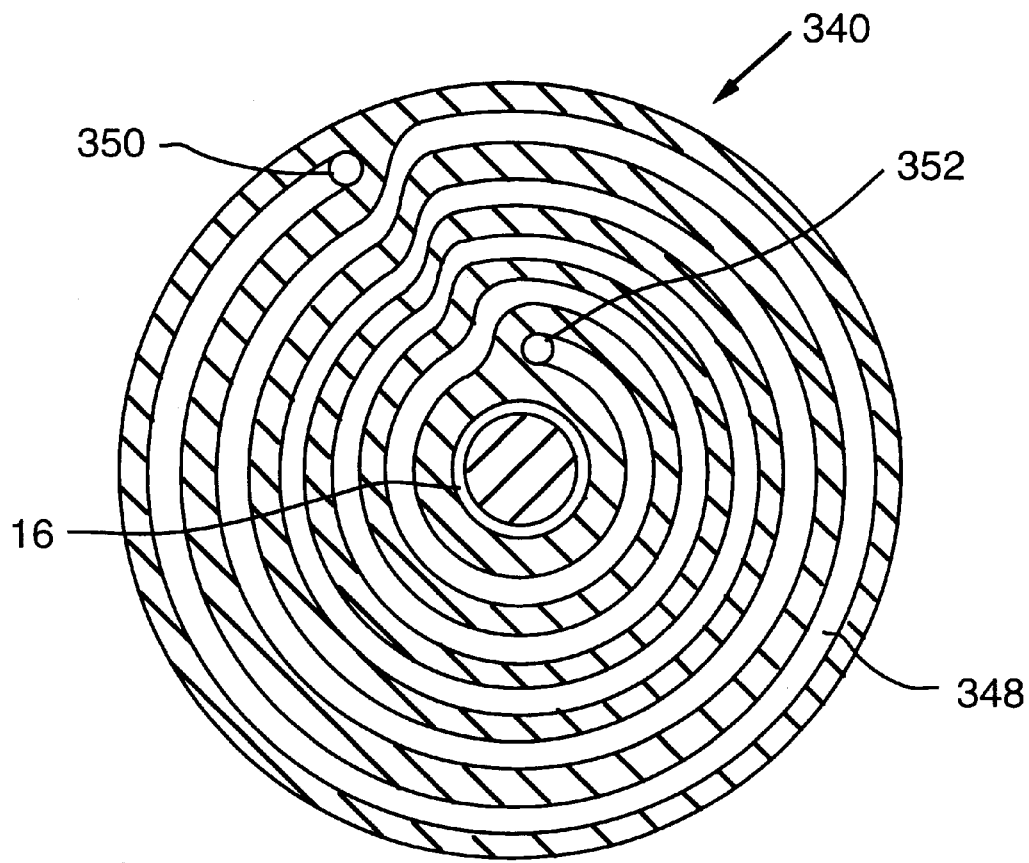
FIG. 8 is a cross sectional view of the fourth embodiment along line 8—8 in FIG. 6.
Figure 9:
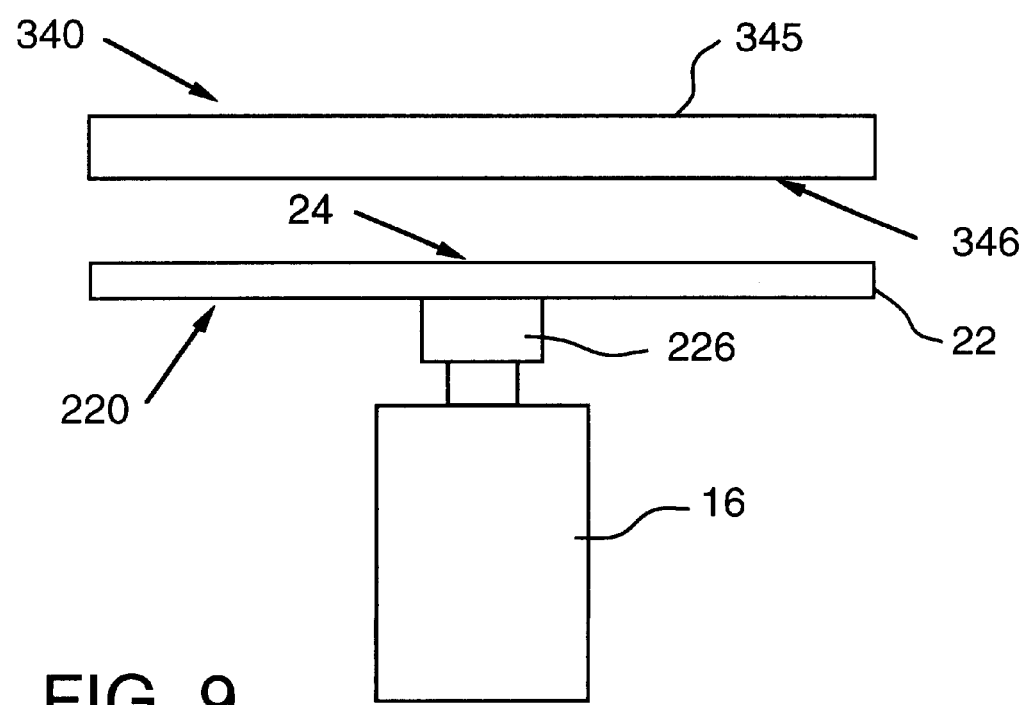
FIG. 9 is a side view of a fifth embodiment of the chuck.

Alternatively, a heat exchanger can be located external to the chuck either in contact with or in close proximity to the support surface 24. FIGS. 5–11 show various embodiments implementing the heat exchanger. In a third embodiment shown in FIG. 5, the heat exchanger 240 consists of a heat exchange jacket 244 fitted around the shaft 226 of the chuck 220. A heat exchange medium is circulated through the jacket 244 to control the temperature of the entire chuck 220. In FIGS. 6–9, fourth and fifth embodiments are shown, wherein a heat exchanger 340 includes a heat transfer device 345, having a heat transfer surface 346 used to contact the chuck 320 opposite the support surface 24 to provide for intermittent heat exchange to either surface of the chuck 220. FIGS. 7 and 8 show the flow path 348 and the inlet 350 and outlet 352 from the heat exchanger 340. FIG. 9 shows the heat transfer surface 346 directly opposing the support surface 24 to provide intermittent contact directly with the support surface 24. In operation of either of these embodiments, the heat transfer surface 46 or the support surface 24 of the chuck 220 is moved into close proximity or contact with the opposing surface between spin processing evolutions such that the operating temperature of the support surface 24 is controlled prior to the placement of the wafer 17 on the support surface 24. In these embodiments, the temperature control thermocouples 38 can alternatively be located in the heat exchange device 345. Once the desired temperature is achieved as determined by the temperature controller 38, the two surfaces are separated and the wafer 17 is placed on the support surface 24. Alternatively, the wafer 17 can be placed onto the surface 24 and the heat exchange device 345 brought into close proximity with the wafer 17 or chuck 220 and heat can be transferred to the wafer 17 and chuck 220. This method effectively eliminates the preheating step necessary in most methods.

Figure 10:
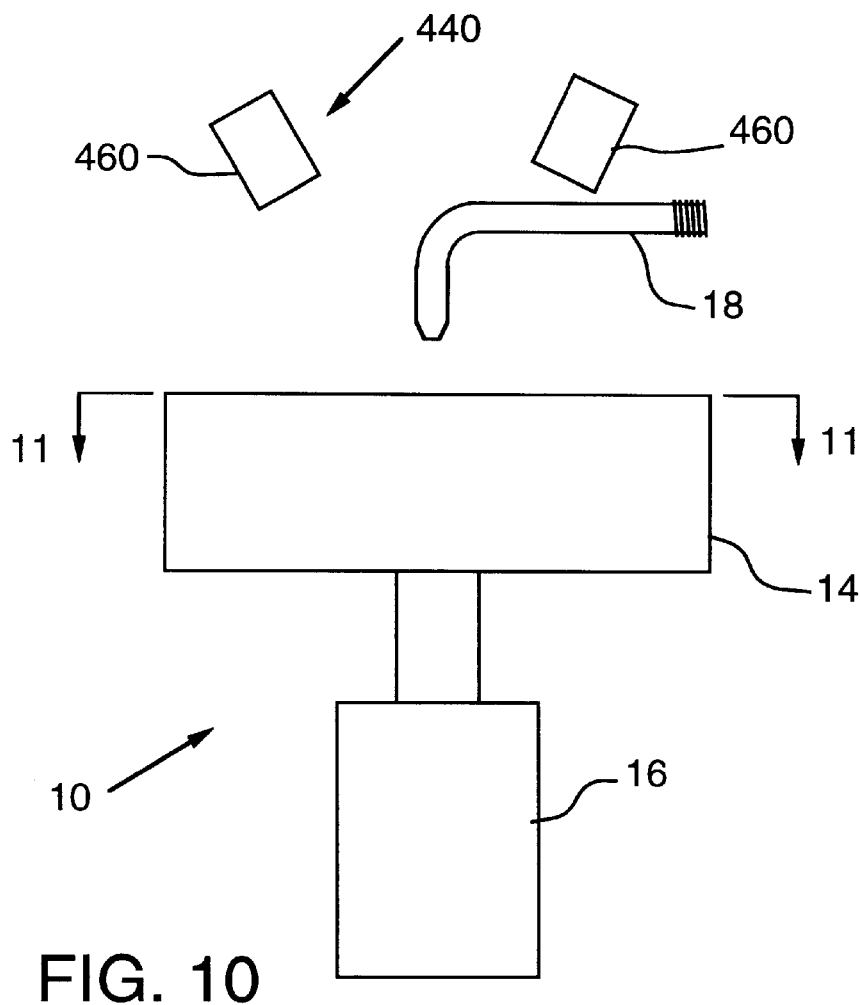
FIG. 10 is a side view of a sixth embodiment of the chuck.
Figure 11:
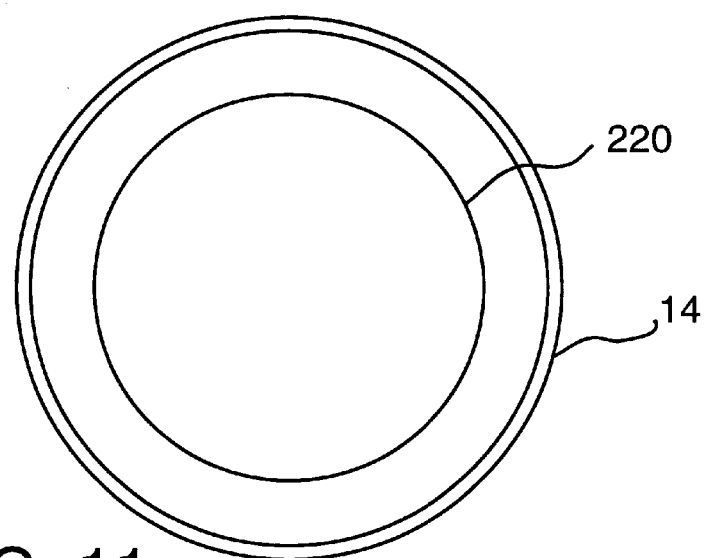
FIG. 11 is a top plan view of the sixth embodiment of the chuck along the line 11—11 of FIG. 10.

In a sixth embodiment, shown in FIGS. 10 and 11, a heat exchanger 440 is used to remotely control the temperature of the chuck 220, such as through the use of heating lamps 460 near the chuck 220 that can also be used to heat the support surface 24 and the wafer 17 during processing.

A method and use of a preferred embodiment of the present invention will be described with respect to the operation of the spin dispensing apparatus 10., Prior to processing the wafer 17, the chuck 20 is preferably maintained near or at the desired temperature for the wafer 17 during spin dispensing. The wafer 17 is placed on the chuck 20 and the wafer 17 is allowed to thermally equilibrate with the chuck 20, analogous to the preheating step in the prior art. The temperature of the chuck 20 is monitored during the heating of the wafer 17 to maintain the desired process temperature. The equilibration of the wafer 17 can be monitored by the heat transfer occurring between the chuck 20 and the heat exchanger 40. The chuck 20 can either be stationary or spinning during the equilibration. After the wafer 17 has thermally equilibrated with the chuck 20, the process liquid is dispensed onto the wafer 17, while the chuck 20 is spinning. During and after the dispensing of the process liquid, heat transfer can be continued to compensate for temperature differences in the process liquid and the wafer 17 and for heat losses to the surrounding environment.

In addition, the temperature controller 38 can be further coupled to a temperature detector in the process liquid. The heat transfer can automatically be initiated at a rate determined by the temperature difference between the process liquid at the beginning of the dispense cycle. In this way, the temperature of the wafer 17 can be actively controlled to provide a more predictable and constant temperature profile across the wafer 17 as discussed below.

EXAMPLES

Testing was performed to determine the effect of varying the temperature of the chuck 20 on the resulting thickness of a process liquid layer that was spin dispensed onto a semiconductor wafer. The testing was performed using a three inch diameter chuck with a water jacketed cooling device mounted on the spindle connected to the shaft of the chuck generally according to the third embodiment, schematically shown in FIG. 5. Photoresist was spin coated onto eight inch diameter wafers having a ⅛inch wide by 3/16inch deep handling notch at an environmental temperature of 21° C. and the operating conditions listed in the table below:

| EXAMPLE NUMBER | FIG. NUMBER | LIQUID TEMP. (° C.) | WAFER TEMP. (° C.) | COOLING WATER TEMPERATURE (° C.), IF USED | % STANDARD DEVIATION THICKNESS |
|---|---|---|---|---|---|
| 1 | 12 | 20.5 | 19.0 | no cooling | 0.101 |
| 2 | 13 | 20.5 | 19.0 | 16.5 | 0.143 |
| 3 | 14 | 20.5 | 19.0 | no cooling | 0.131 1st |
|   | 15 |      |      |             | 0.149 7th |
|   | 16 |      |      |             | 0.119 15th |
| 4 | 17 | 20.5 | 19.0 | 16.5 | 0.141 |
|   | 18 |      |      |      | 0.155 |
| 5 | 19 | 21.0 | 19.0 | 16.5 | 0.137 |
| 6 | 20 | 20.5 | 20.5 | 16.5 | 0.202 |

FIGS. 12–20 present the percentage deviation of the thickness of the photoresist layer as a function of distance from the center of the wafer at 49 locations. The direction of the profile is indicated by a solid line across the wafer schematic in each figure and the location of the notch is shown as a flat surface on the wafer schematic.

Example 1

Figure 12:
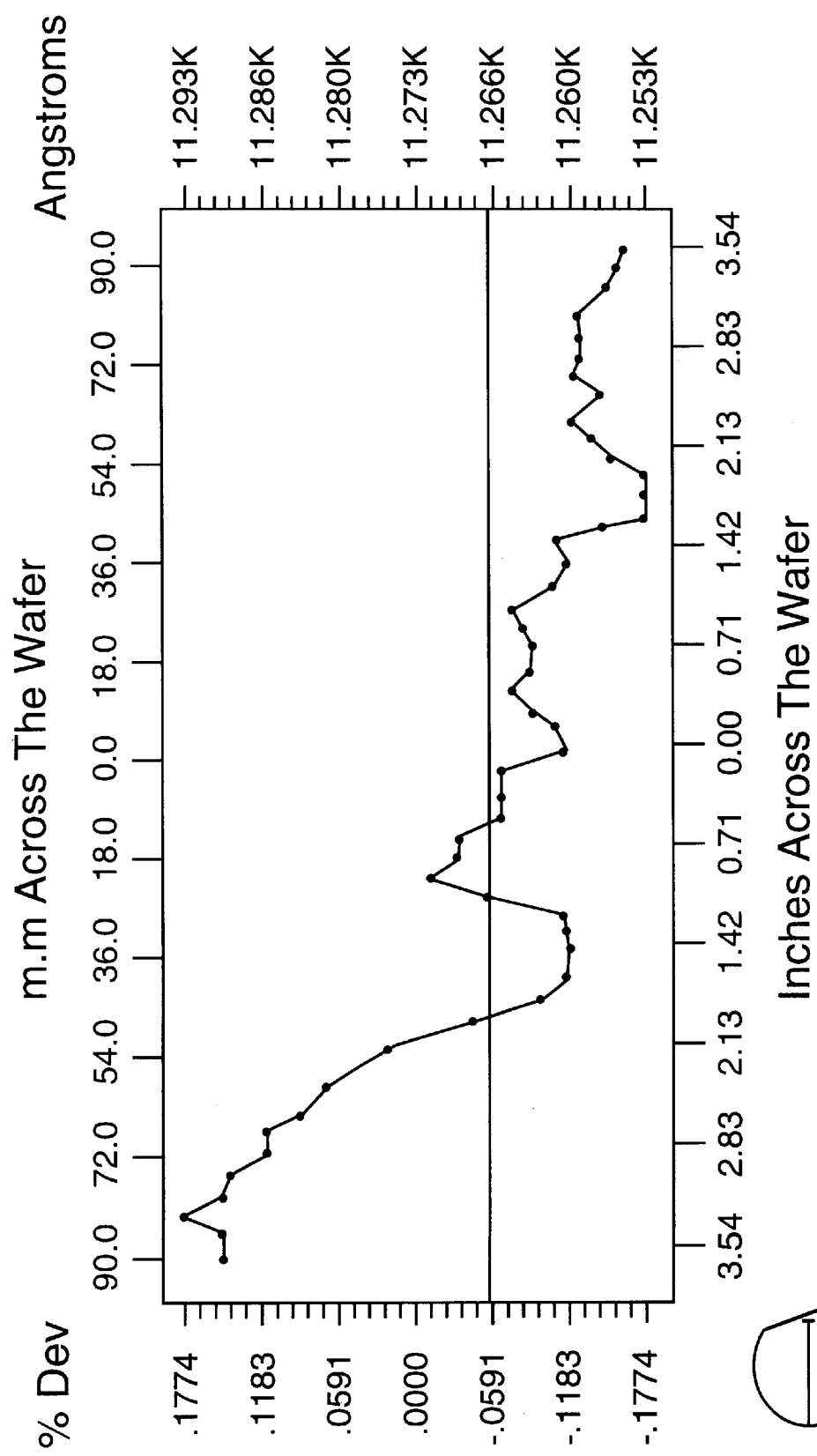
FIG. 12 is a plot of the percentage deviation of the thickness of the photoresist layer of Example 1 as a function of distance from the center of the wafer.

A chilled wafer was placed on the chuck and cooling water was not circulated through the heat exchanger, thereby allowing heat to be transfer from the spin motor to the chuck. The profile in FIG. 12 shows that the resulting coating layer is fairly uniform with a peak to peak maximum to minimum variation of approximately 0.36% when the temperature of the wafer is allowed to equilibrate with the temperature of the photoresist and the environment. The profile, however, is not uniform and the change in the profile at the edges of the chuck (approximately 1.5 inches) indicates the chuck is having an effect on the thickness profile. Also, there appears to be an edge effect, as evidenced by the deviation of the thickness near the curved edge being substantially greater than the deviation near the edge of the wafer containing the notch. The edge effect was later found to primarily be an artifact of the orientation of the wafer using the notch during a baking process following the spin coating and not a directly related of the spin coating process itself.

Example 2

Figure 13:
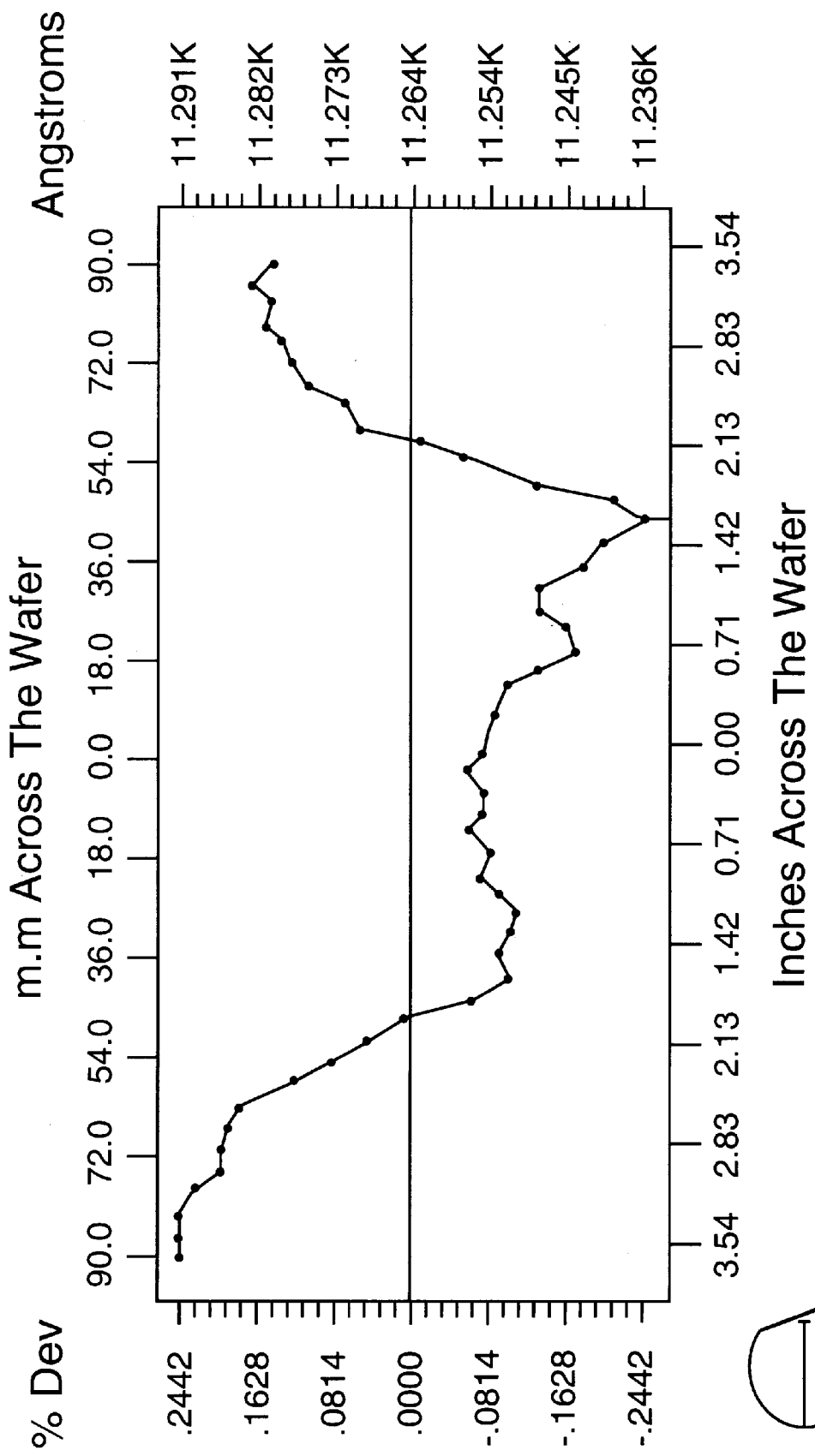
FIG. 13 is a plot of the percentage deviation of the thickness of the photoresist layer of Example 2 as a function of distance from the center of the wafer.
Figure 14:
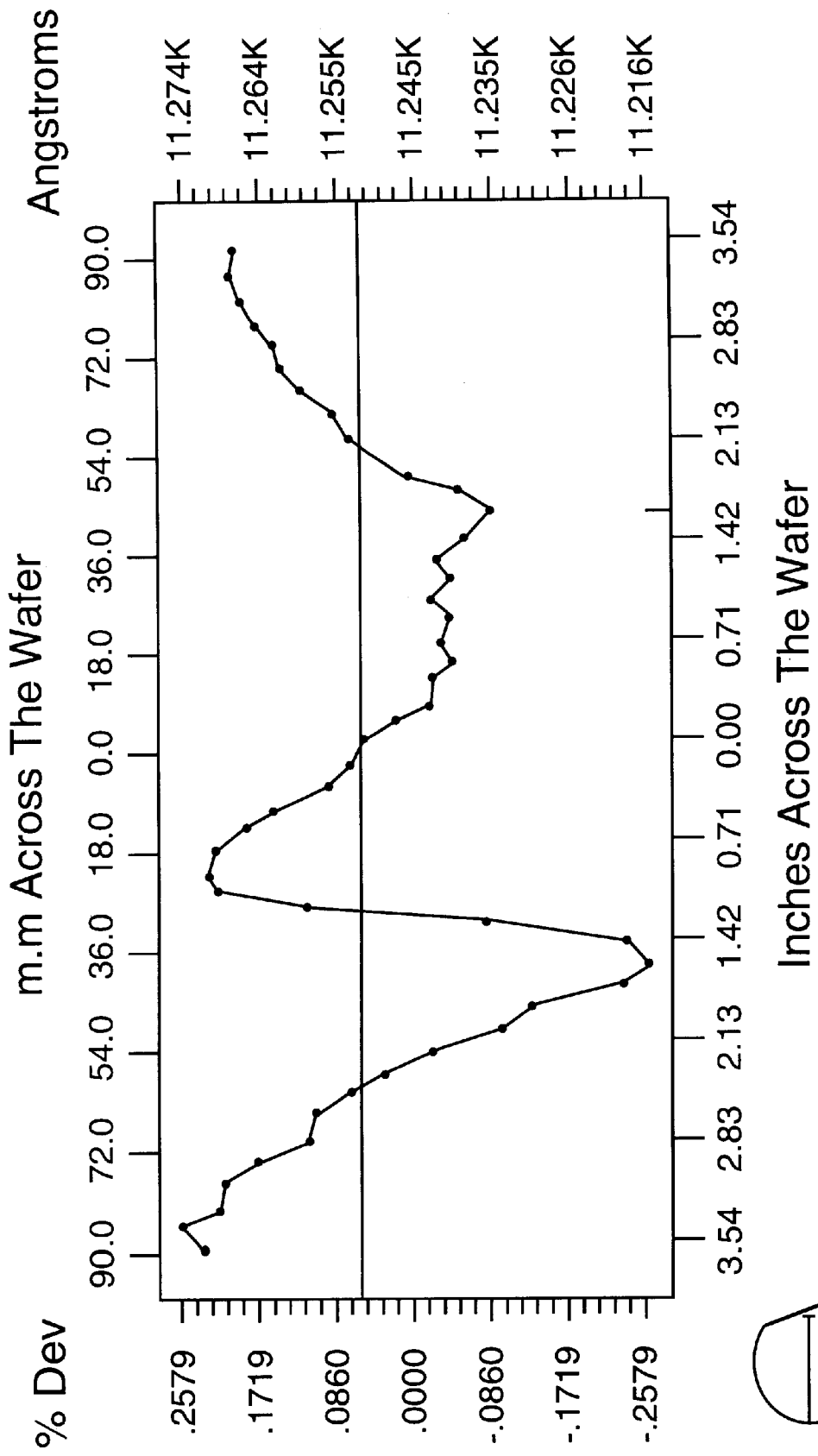
FIG. 14 is a plot of the percentage deviation of the thickness of the photoresist layer on wafer #1 of Example 3 as a function of distance from the center of the wafer.
Figure 15:
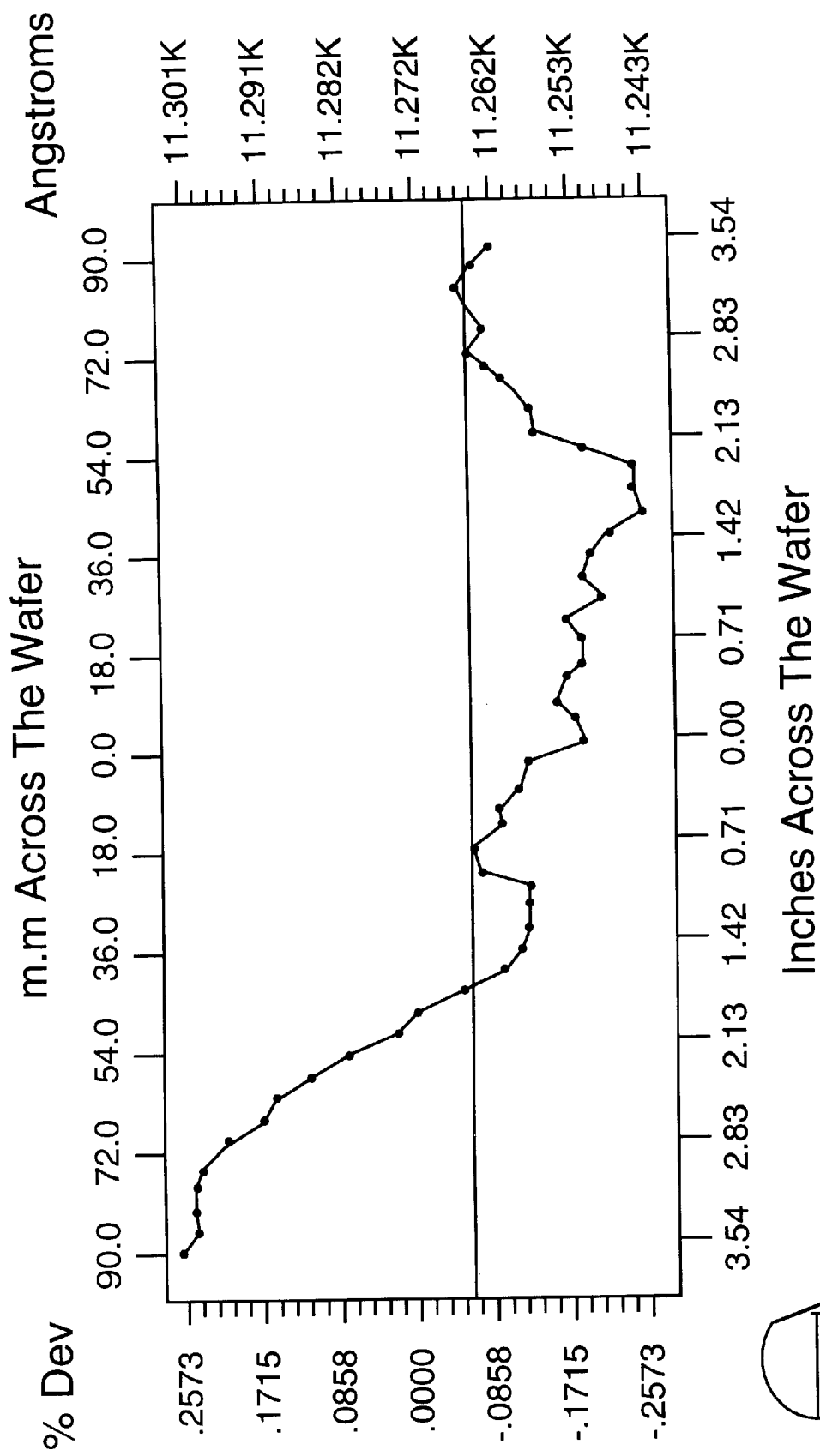
FIG. 15 is a plot of the percentage deviation of the thickness of the photoresist layer of on wafer #7 of Example 3 as a function of distance from the center of the wafer.
Figure 16:
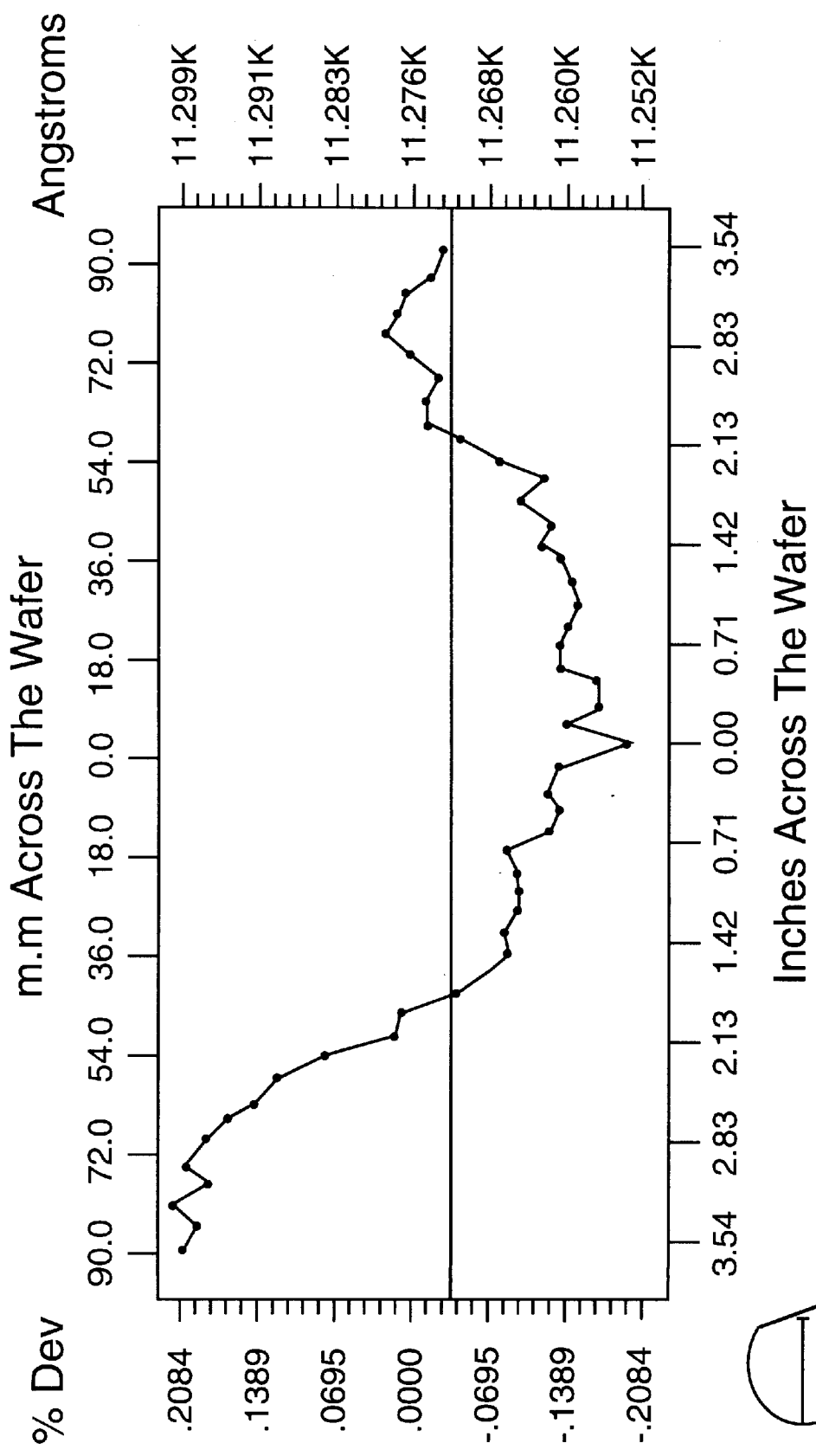
FIG. 16 is a plot of the percentage deviation of the thickness of the photoresist layer on wafer #15 of Example 3 as a function of distance from the center of the wafer.

The same conditions as example 1 except chill water was circulated through the heat exchanger to control the temperature of the chuck at a lower temperature. As shown in FIG. 13, the resulting profile is substantially different from the profile in FIG. 12 and tends to follow the temperature profile as defined by the cooling water in the chuck 20. The portion of the wafer in contact with the chuck (0.00–1.5 inches) is significantly thinner than the portion of the wafer not in contact with the chuck (greater than 1.5 inches from the centerline). The peak to peak variation is also substantially greater (approximately 0.48%).

Example 3

Circulation of the cooling water was discontinued and fifteen wafers were serially processed without allowing the chuck to reequilibrate following the discontinuing of the flow of the cooling water. The testing was performed to examine the transient temperature behavior of the chuck and the resulting profiles. The first, seventh and fifteenth wafers in the series were profiled and are presented in FIGS. 14–16. As can be seen in the figures, the heating of the chuck results in a wide variation in the profiles of the layers. The maximum peak to peak deviation decreases from 0.55% for the first wafer to 0.42% by the fifteenth wafer and the profile transition to one similar to the profile in Example 1. The first wafer shows a wide variation in the layer thickness over the portion of the wafer in contact with the chuck which is thought to be due to maldistributions in the temperature as the chuck equilibrates with the surrounding environment. By the time the seventh wafer is processed, the temperature of the chuck apparently has equilibrated to the extent that the profile is very similar to the profile in example 1. Some degree of maldistribution does appear to persist in over the portion of the wafer in contact with the chuck similar to that on the first wafer. The fifteenth wafer has a profile that is relatively symmetric, although there remains a difference between the profile near the notched edge. The profile obtained from wafers one, seven and fifteen could imply that some degree of thermal maldistribution was present in the chuck during the dispensing of the coating on the wafer analyzed in Example 1.

Example 4

Figure 17:
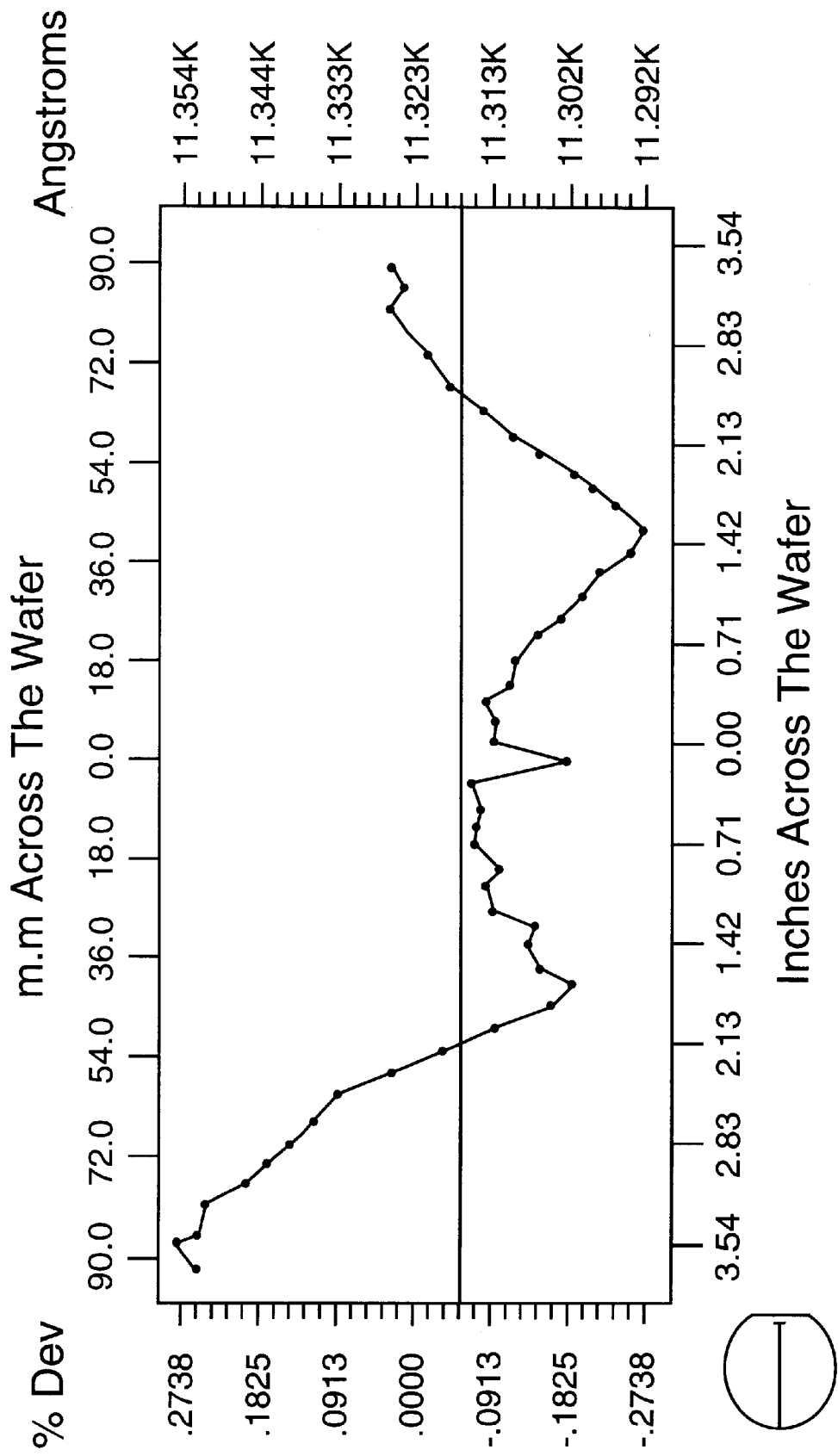
FIG. 17 is a plot of the percentage deviation of the thickness of the photoresist layer on the wafer of Example 4 as a function of distance from the center of the wafer.
Figure 18:
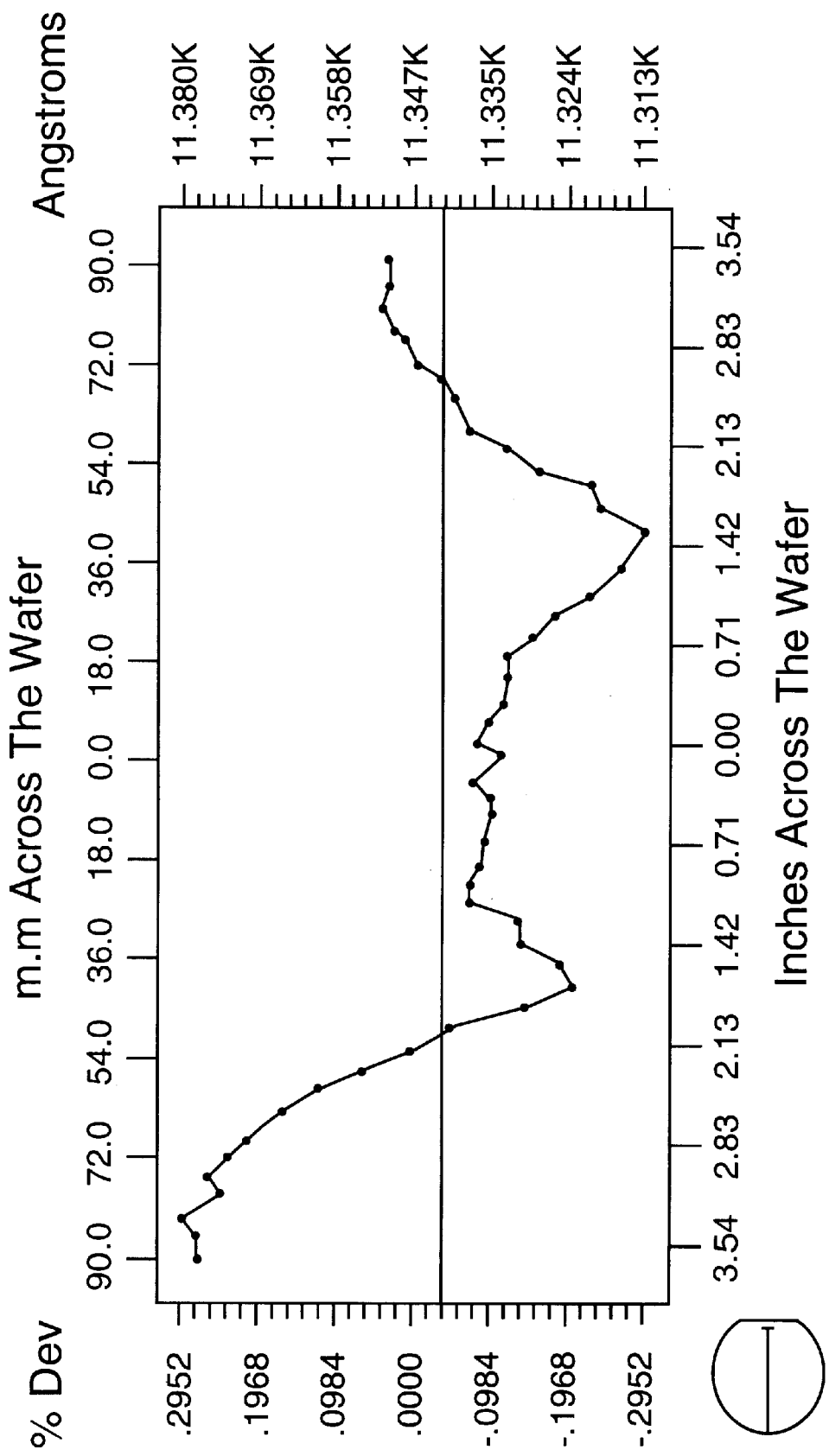
FIG. 18 is a plot of the percentage deviation of the thickness of the photoresist layer on wafer #1 of Example 5 as a function of distance from the center of the wafer.

Cooling water was circulated through the heat exchanger using the same conditions as in Example 1 and two wafers were processed. A profile was taken across a different cross section, as shown in FIGS. 17 and 18 to examine the variation in the profile. The profiles shown in the figures are consistent with the profile in Example 2 demonstrating the repeatability of controlling the temperature of the chuck to control the thickness of the coating layer.

Example 5

Figure 19:
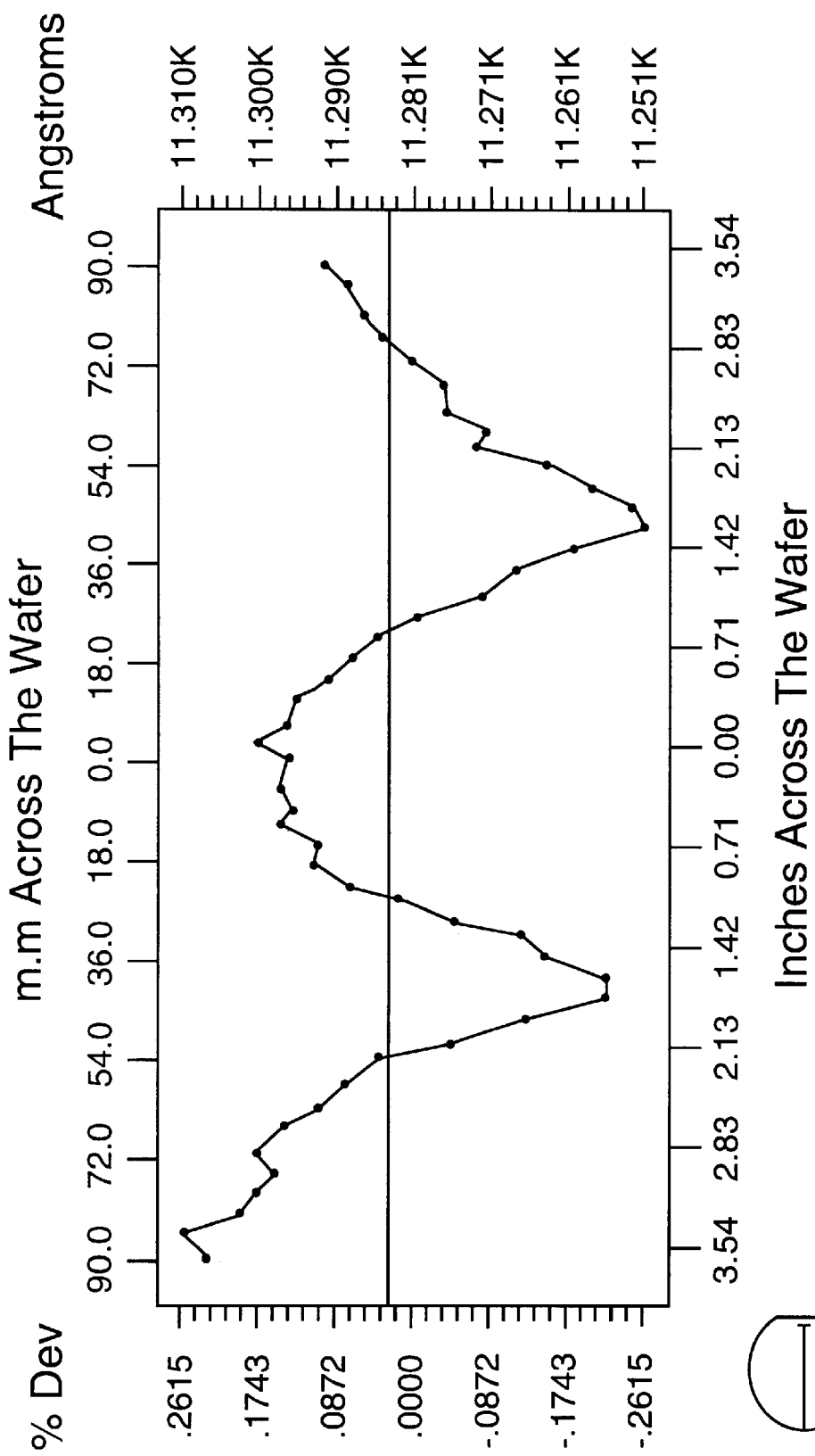
FIG. 19 is a plot of the percentage deviation of the thickness of the photoresist layer on wafer #2 of Example 5 as a function of distance from the center of the wafer; and, FIG. 20 is a plot of the percentage deviation of the thickness of the photoresist layer on the wafer of Example 6 as a function of distance from the center of the wafer.

The temperature of the photoresist was increased in comparison with the conditions in Example 1 to attempt to compensate for the cooling of the chuck. As can be seen in FIG. 19, a larger deviation occurred with a maximum to minimum peak to peak variation of approximately 0.52%. In addition, a significant gradient developed over the portion of the wafer in contact with the chuck.

Example 6

Figure 20:
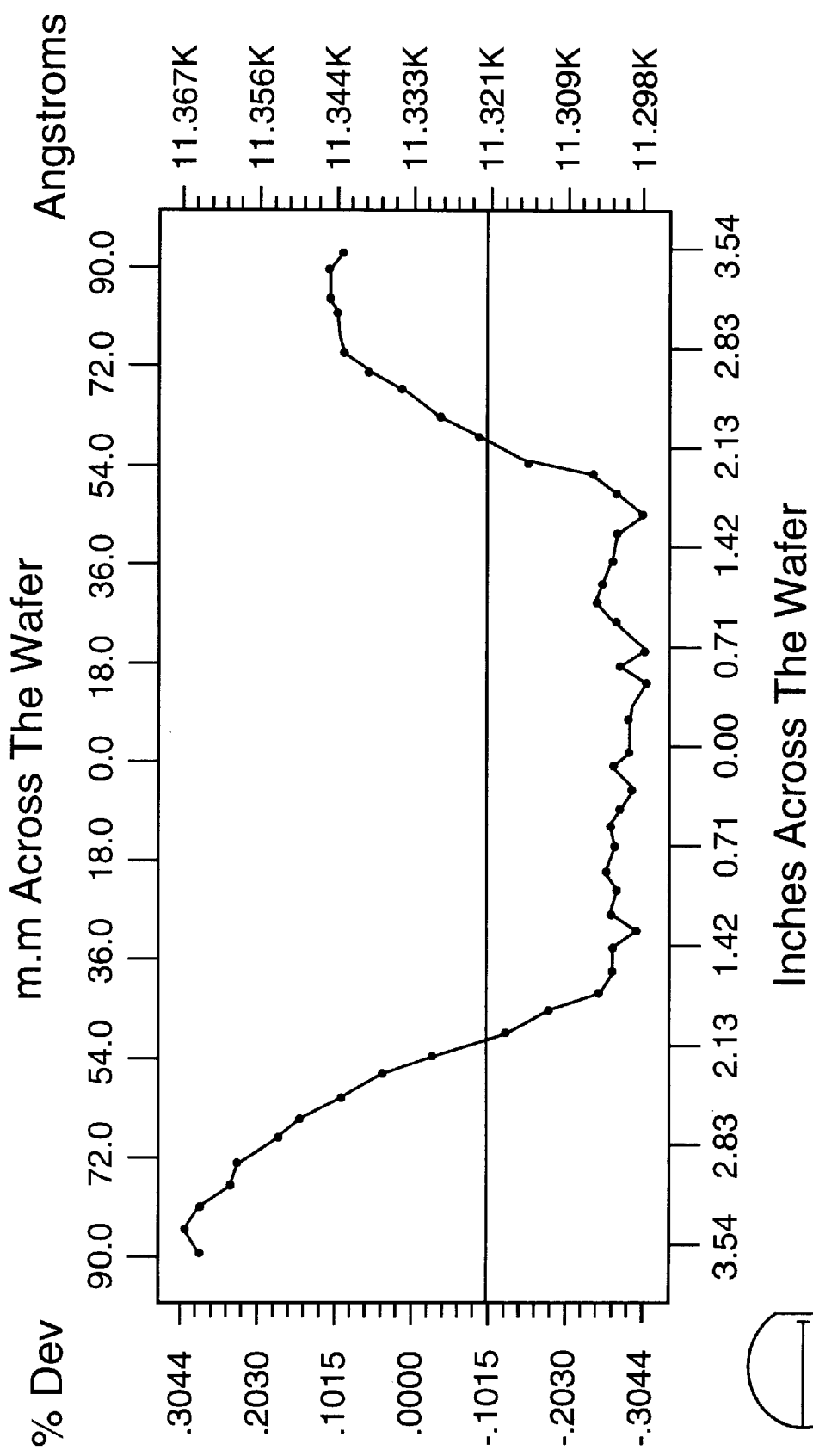

The temperature of the wafer was increased in comparison to the conditions in Examples 1–5. As can be seen in FIG. 20, the higher temperature of the wafer resulted in the photoresist preferentially moving toward the outer edges of the surface resulting in a significant maldistribution of the thickness. The thickness of the coating layer on the portion of the wafer in contact with the chuck exhibits a dramatically different profile further demonstrating the importance of directly controlling the temperature of the chuck.

Those of ordinary skill in the art will appreciate that the present invention provides advantages over the prior art. In particular, the subject invention provides for a more uniform and a predictable coating layer on a semiconductor wafer substrate by actively controlling the temperature of the chuck. It can be appreciated that by actively controlling the temperature of the chuck, an increased level of control over the thickness of the layer can be maintained. The increased level of control can also be used to purposefully vary the thickness of the layer over the surface of the water by adjusting the temperature profile of the wafer during spin dispensing. In addition, by directly controlling the temperature of the wafer, environmental control and preconditioning equipment used to indirectly control the temperature of the wafer during the spin coating step can be either eliminated or minimized, thereby reducing the overall footprint and cost of the processing system. While the subject invention provides these and other advantages over prior art, it will be understood, however, that various changes in the details, materials and arrangements of parts and steps which have been herein described and illustrated in order to explain the nature of the invention may be made by those skilled in the art within the principle and scope of the invention as expressed in the appended claims.

What is claimed is:

1. A wafer temperature control apparatus comprising:
    a chuck having a wafer support surface sized such that a wafer supported thereon does not protrude beyond said wafer support surface and a surface opposing said wafer support surface;
    a heat exchanger displaceable into close proximity with said opposing surface of said chuck; and a temperature controller connected to said heat exchanger.

2. The apparatus of claim 1 wherein said heat exchanger comprises a heat exchange jacket disposed around said chuck.

3. The apparatus of claim 1 wherein said heat exchanger includes a fluid passage through which heat transfer media is circulated.

4. The apparatus of claim 1 wherein said heat exchanger includes an opposing surface which is displaceable into close proximity to said support surface.

5. The apparatus of claim 1 wherein said heat exchanger contacts said opposing surface.

6. The apparatus of claim 1 wherein said temperature controller includes at least one thermocouple disposed within said heat exchanger.

7. The apparatus of claim 2, wherein said heat exchange jacket is disposed around a shaft of said chuck.

8. The apparatus of claim 1, wherein said temperature controller includes at least one thermocouple disposed within said chuck.

9. The apparatus of claim 1, wherein said temperature controller includes at least one temperature detector disposed within said chuck.

10. The apparatus of claim 1, wherein said temperature controller includes at least one temperature detector disposed within said heat exchanger.

11. The apparatus of claim 1, wherein said chuck is fabricated from aluminum.

12. The apparatus of claim 1, wherein said heat exchanger includes a resistance heater.

13. The apparatus of claim 1, wherein said heat exchanger includes a thermoelectric cooling device.

14. A wafer temperature control apparatus, comprising:

a chuck having a wafer support surface sized such that a wafer supported thereon does not protrude beyond said wafer support surface and a surface opposing said wafer support surface;

a heat exchanger disposed adjacent said opposing surface of said chuck and selectively movable into close proximity with said opposing surface of said chuck and away from said chuck; and a temperature controller connected to said heat exchanger.

15. A temperature control apparatus for a wafer, said temperature control apparatus comprising:

a chuck having a wafer support surface and a surface opposing said wafer support surface;

a heat exchanger having a single spiraling fluid-receiving passage therein, said element selectively positionable in close proximity with said opposing surface of said chuck.

16. The temperature control apparatus of claim 15 further comprising a temperature controller connected to said heat exchanger.

17. The temperature control apparatus of claim 15 wherein said single spiraling passage has an inlet passage and an outlet passage.

18. The temperature control apparatus of claim 17 wherein said inlet passage is adjacent an outer edge of said heat exchanger and wherein said outlet passage is adjacent a central portion of said heat exchanger.

19. The temperature control apparatus of claim 15 further comprising:

a spin motor attached to said chuck; and a centrally disposed opening in said heat exchanger through which a portion of said spin motor extends.

20. The temperature controller of claim 15 wherein said wafer support surface is at least as large as a wafer to be supported thereon.

* * * * *

UNITED STATES PATENT AND TRADEMARK OFFICE
CERTIFICATE OF CORRECTION

PATENT NO. : 6,107,608
DATED : August 22, 2000
INVENTOR(S) : Bruce L. Hayes

It is certified that error appears in the above-identified patent and that said Letters Patent is hereby corrected as shown below:

Column 2,
Line 23, delete "components the" and replace therewith -- components, the --.

Column 4,
Line 13, delete "layer of on" and replace therewith -- layer on --.

Column 6,
Line 14, delete "10.," and replace therewith -- 10. --.
Line 48, delete "1/8inch" and replace therewith -- 1/8 inch --.
Line 48, change "3/16inch" and replace therewith -- 3/16 inch --.

Column 7,
Line 11, delete "transfer" and replace therewith -- transferred --.
Line 25, delete "not a directly" and replace therewith -- not directly --.
Line 26, delete "of" and replace therewith -- to --.
Line 30, delete "chill" and replace therewith -- chilled --.
Line 62, delete "over".

Signed and Sealed this

First Day of June, 2004

JON W. DUDAS
*Acting Director of the United States Patent and Trademark Office*